United States Patent [19]

Powell

[11] 4,171,522

[45] Oct. 16, 1979

[54] ELECTRONIC ANGULAR POSITION ENCODER APPARATUS

[75] Inventor: J. Anthony Powell, North Olmstead, Ohio

[73] Assignee: Real Time Systems, Inc., Mount Vernon, N.Y.

[21] Appl. No.: 889,018

[22] Filed: Mar. 22, 1978

[51] Int. Cl.² ............................................. H03K 13/02
[52] U.S. Cl. ............................ 340/347 P; 235/92 MP
[58] Field of Search .............. 340/347 P, 359, 347 M; 235/92 DM, 92 MP, 92 EQ; 364/560; 250/231 SE

[56] References Cited

U.S. PATENT DOCUMENTS

| | | | |
|---|---|---|---|
| 3,865,305 | 2/1975 | Sampey | 235/92 DM |
| 4,064,504 | 12/1977 | Lepetit | 250/231 SE |

Primary Examiner—Charles D. Miller
Attorney, Agent, or Firm—Arthur L. Plevy

[57] ABSTRACT

The encoded angular position of a rotating object is produced by an electronic digital counter that is clocked by a programmable frequency source. The source frequency is adjusted as necessary by a processor so that the number of counts registered by the counter is the same for each revolution of the rotating object. A sensor provides a signal once during each revolution of the rotating object when it passes some reference angular position. The signal strobes the current count into an output buffer register, resets the counter to zero, and then activates the processor. The processor in turn, checks if the count in the output buffer register is within a given tolerance of the desired count for one revolution, and then, if necessary, programs the source to the correct frequency. Thus, the number of counts for each revolution will remain approximately constant, independent of the angular velocity. At any point during each revolution of the rotating object, the counter can be strobed and the current count transferred to the output buffer register. This output can be used as a measure of the angular position of the rotating object at the time of the strobe signal.

10 Claims, 1 Drawing Figure

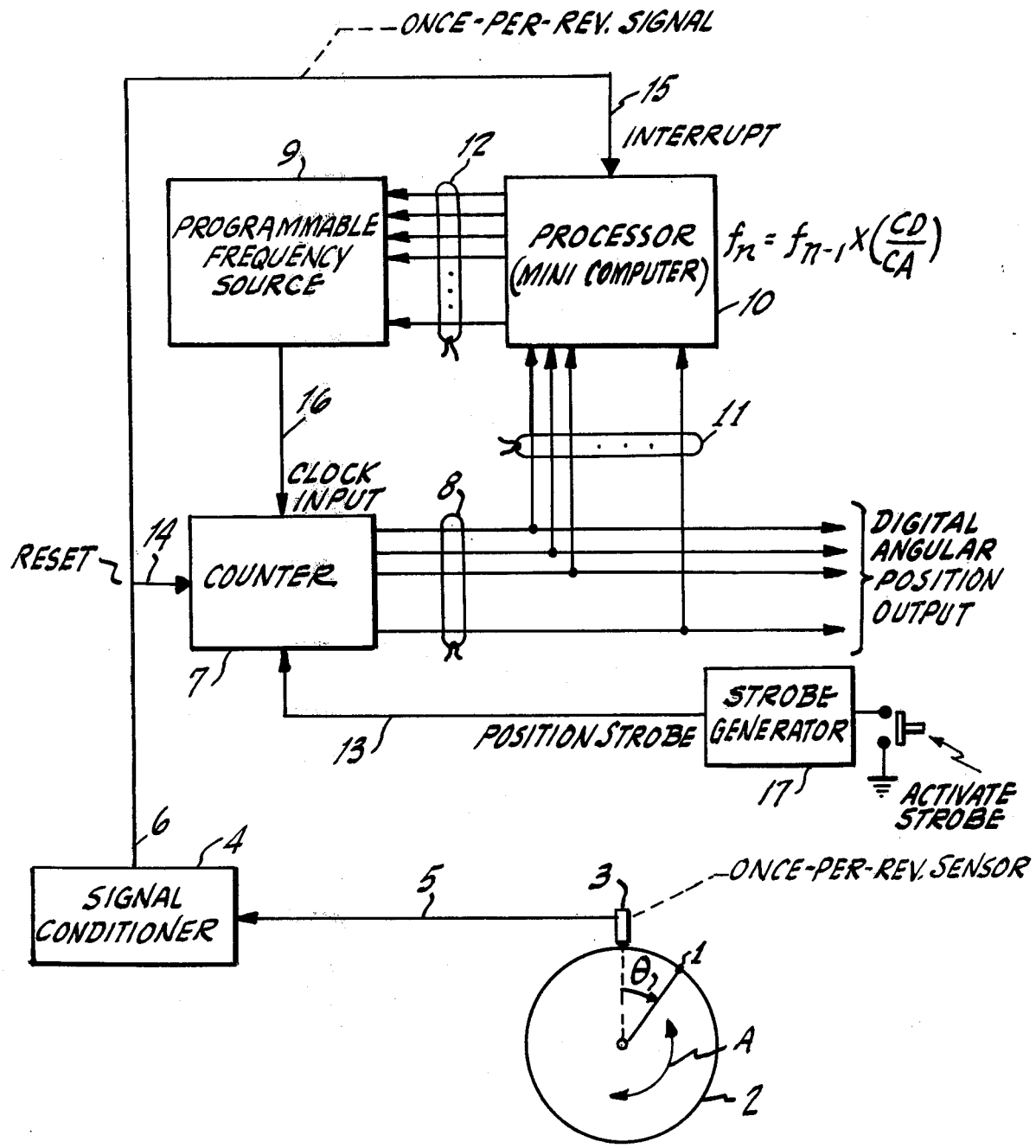

ELECTRONIC ANGULAR POSITION ENCODER APPARATUS

ORIGIN OF THE INVENTION

The invention described herein was made by an employee of the U.S. Government and the Government has a non-exclusive, irrevocable, royalty-free license in said invention and under this patent with power to grant licenses for all Government purposes.

BACKGROUND OF INVENTION

This invention relates to angle encoding apparatus and more particularly to apparatus for encoding a present angular position of a rotating object and to develop an output signal indicative of said position. Many rotating objects are rotated about a cylindrical shaft which supports the object and which is driven by a suitable drive mechanism such as a motor and so on.

There exists a number of devices which are employed for encoding the angular position of the rotating shaft. These devices are referred to as shaft angle encoders. Certain prior art encoders employ a disk upon which a code pattern is impressed. The disk is coupled to a shaft and is concentric with the shaft. As the shaft rotates, the disk rotates and a code pattern is impressed on the disk. The code pattern is indicative of the angle or the position of the shaft about its circumference. Hence, one can read the code by means of electrical or optical transducers and provide an output indicative of the code and therefore, indicative of the current angular position of the rotating object.

There are other types of encoders which operate in various ways in order to determine the angular position of an object when subjected to rotation. Examples of such devices may be had by referring to the following patents:

U.S. Pat. No. 3,767,902 entitled ENGINE MEMBER POSITION PREDICTOR describes a system for predicting the position of a moving member of an automobile engine such as a crank shaft.

U.S. Pat. No. 3,916,186 entitled SPINNING VANE SHAFT POSITION ENCODER describes a system whach reads the positions of one or more coaxial shafts in terms of time intervals produced by optical scanning.

U.S. Pat. No. 3,935,570 entitled SPINNING DISK SHAFT POSTIONING CODER describes a system which reads positions of coaxial shafts as above described by responding to interception invervals of a beam of light.

Still other patents exist which show various techniques for determining angle position of various rotating objects.

Certain disadvantages exist with prior art encoders. Some of these encoders have to be physically connected to the rotating object or the shaft. This, of course, poses many problems in regard to rotating objects where the shaft is not easily accessible as, for example, the drive shaft of a jet engine and so on. More important is the fact that the prior art devices based on construction and so on, impose severe limits on the maximum angular velocity at which they can be used. Thus, there is a problem in using such encoders in high speed rotating equipment.

It would therefore be an object of the present invention to provide apparatus for encoding the angular position of a rotating object employing simple and reliable apparatus while further eliminating the need for making a physical connection to the object or to the shaft associated with the object. The apparatus to be described enables one to encode the angular position of high speed rotating objects; which objects do not necessarily have to be associated with an accessible shaft.

BRIEF DESCRIPTION OF PREFERRED EMBODIMENT

Apparatus for providing a signal indicative of the angular position of a rotating object comprising sensor means located proximate to said object and operative to provide an output pulse indicative of a revolution of said object, a controllable frequency source capable of providing a signal frequency at an output selected according to the velocity of rotation of said object and having an input adapted when activated to vary said frequency according to the velocity of rotation of said object, a counter having an input coupled to said frequency source and operative to provide at an output a code indicative of said signal frequency as applied to said input, said counter responsive to said sensor output pulse to provide said code during each revolution of said object, processing means having an input coupled to said counter output for responding to said code to determine if said code manifests a first value within a predetermined range indicative of a desired rotational velocity of said object and for providing an output control signal indicative of said desired rotational velocity when said first value is not within said range, and means coupling the output of said processing means to said control input of said frequency source to cause said source to provide another frequency according to said processing output signal to cause said counter to provide said code indicative of said angular position of said object and relatively independent of said velocity.

BRIEF DESCRIPTION OF THE FIGURE

The sole FIGURE is a block diagram of an angular position encoder according to the invention.

DETAILED DESCRIPTION OF INVENTION

Referring to the FIGURE, there is shown a target 1 which is positioned on the surface of a rotating object. For present purposes, the target 1 may be a reflecting target such as a piece of reflecting tape or a painted mark. A target 1 is mounted on the rotating object 2 at a desired location. While a reflecting target will be described, it is understood that the target 1 may be a magnetic area and so on.

Positioned in proximity to the rotating object 2 is an optical sensing device 3. As can be seen, for a single rotation of the object 2 in either a clockwise or counterclockwise direction, the sensor will provide one pulse per revolution. This operation is well known and as indicated above, one could employ any type of target and sensing apparatus such as optical, magnetic, or an electrical device. The main aspect being that the sensor 3 does not coact with or contact the rotating object.

Coupled to the sensor 3 is a signal conditioner circuit 4. The function of the signal conditioner circuit 4 is to respond to the signal produced by the sensor once per revolution. Essentially, the signal conditioner circuit serves to provide a compatible type of pulse output which can be employed to activate existing integrated circuit components. Such a signal conditioner for example, may comprise a monostable multivibrator or other device which would respond to the once per revolution signal and provide an output signal having a suitable duration with reasonable rise and fall times.

The pulse 6 at the output of the signal conditioner 4 determines the zero angular reference position of the rotating object. This pulse is applied to the reset input 14 of a counter 7 and to the interrupt input 15 of a processor circuit 10.

The counter 7 is a sixteen bit digital counter having a sixteen bit parallel output designated by the reference numeral 8. Many counters as 7 are commercially available or can be fabricated from standard integrated ciruits as available from companies such as Texas Instruments, Motorola and so on.

The counter has a clock input 16. The clock input of the counter is coupled to a programmable frequency source 9. Essentially, the frequency source 9 is a frequency synthesizer or signal generator capable of providing a stable output reference frequency; which frequency can be varied by means of a control signal applied to an input control circuit associated with the frequency source 9. An example of a suitable frequency source 9 is available from a company called Real Time Systems, Inc., the Assignee herein located in Mount Vernon, N.Y. and sold as the Model 37 Coherent Frequency Synthesizer.

The synthesizer can be programmed in frequency up to 12 MHz in steps of 1 Hz. The synthesizer has a twenty-four bit parallel binary input and can be programmed in less than 0.5 microseconds to change frequency with no loss of output clock pulses.

As shown in the schematic, a processor 10 controls the frequency of the source 9 by means of the output leads 12 which are coupled from the processor to the programmable inputs of the source 9. The inputs to the processor 10 are derived from the output of the counter 8. Essentially, the processor 10 is coupled to the output leads 8 of the counter and stores the counter outut in an input buffer associated with the processor 10 and as will be explained, operates on the counted output to provide a control signal for application to the source 9 via the leads 12.

Also shown in the FIGURE is a strobe generator 17. The strobe generator 17 produces an output strobe signal 13 which functions to load the counter output register, associated with leads 8, with the present count; which count as will be explained, is indicative of the angular position of the rotating object 2. Hence, upon receipt of a position strobe on lead 13, the counter will provide at output 8, a signal indicative of the angular position of the rotating object 2.

Basically, as will be explained, the processor 10 can be implemented by the use of a minicomputer circuit and essentially operates to solve an equation definitive of the frequency applied to the counter; which frequency is produced by the source 9 under control of the processor 10.

The above described system operates as follows:

As indicated, the output pulse of the conditioner 4 operates to load the counter output buffer register with the current count during the presence of the pulse. During the next pulse on lead 6, the counter is then reset to zero to initiate the next count. The pulse is also applied to the interrupt input 15 of the processor 10. This enables the processor 10 to initiate the following routine:

Upon receipt of the pulse, the processor reads the counter output buffer register and checks to determine whether the counter output is within a predetermined tolerance with a desired count for one revolution. If not, the processor 10 computes a new synthesizer frequency according to the equation:

$$fn = fn-1 \times (C_D/C_A)$$

where
fn = new frequency
fn−1 = previous frequency
$C_D$ = desired count for one revolution
$C_A$ = actual count for one revolution The equation as seen is depicted on the FIGURE adjacent the processor 10.

It is now noted that there are many circuits which can perform to solve the above noted equation including microprocessors, miniprocessors, or a hard wire logic circuit. Thus, it is well within the skill of one familiar with the art to arrive at a logical configuration capable of solving the above noted equation.

Upon a determination that the frequency is to be altered, the processor then provides at its outputs 12, a control signal for varying the frequency of the source 9 according to the new frequency. The counter 7 will not respond to a positioned strobe until the processor 9 has completed its reading of the counter output. In this manner, the output of the counter as controlled, is always indicative of the true angular position of the rotating object 2.

An operating requirement of the above noted system is that the fractional change in angular velocity of the rotating object 2 for each revolution is small compared to the desired resolution in the angular position. This requirement is easily afforded in many applications involving high angular velocities or involving rotating objects with large moments of inertia.

In one application, it is desired to determine the angular position of a jet engine compressor rotor at certain times. The rotor rotates at approximately 18,000 revolutions per minute. The desired angular position resolution is one part in 4,000 or 0.1 degree. In order to achieve this resolution, the frequency output of source 9 is programmed at the beginning of each revolution based on a desired count of 16,000 (four times 4,000) and a tolerance of two counts for one revolution. Under these conditions, the nominal output frequency from source 9 is 4.8 MHz. The processor 10 requires less than 0.1 millisecond to read the once per revolution count, compute a new frequency, and program the source 9. This time is small compared to the 3.3 milliseconds required for one revolution and hence, if a minicomputer is used, it can be time shared to accommodate other data processing requirements.

Thus, as described above, a system has been developed which does not require a physical connection to a rotating object or to a shaft associated therewith. The system can operate with objects rotating at high angular velocities, say 18,000 rpm, or greater and provide an accurate output indication of the angular position of the object.

It should be obvious to one skilled in the art that many modifications exist and many components could be substituted with alternate configurations without departing from the spirit and scope of the present invention.

It is thus seen that the number of counts provided by counter 7 remains approximately constant for each revolution of the object 2 and relatively independent of the angular velocity. Thus, by strobing the counter by means of activating the strobe generator 16, the present count of the counter is determined. The output of the counter can be used as a measure of the angular position of the rotating object at the time of the strobe signal. This therefore, enables one to accurately monitor the characteristics of the rotating object at all angular positions and to derive a control signal indicative of the angle position for use in servo loops and so on or for testing facilities.

While the invention has particular application in the testing of jet engines, it is of course, adaptable for use as an angular position encoder in regard to any rotating object and will operate to do so while providing the advantages described above.

I claim:

1. Apparatus for providing a signal indicative of the angular position of a rotating object, comprising:
   (a) sensor means located proximate to said object and operative to provide an output pulse indicative of a revolution of said object,
   (b) a controllable frequency source capable of providing a signal frequency at an output selected according to the velocity of rotation of said object and having an input adapted when activated to vary said frequency according to the velocity of rotation of said object,
   (c) a counter having an input coupled to said frequency source and operative to provide at an output a code indicative of said signal frequency as applied to said input, said counter responsive to said sensor output pulse to provide said code during each revolution of said object,
   (d) processing means having an input coupled to said counter output for responding to said code to determine if said code manifests a first value within a predetermined range indicative of a desired rotational velocity of said object and for providing an output control signal indicative of said desired rotational velocity when said first value is not within said range, and
   (e) means coupling the output of said processing means to said control input of said frequency source to cause said source to provide another frequency according to said processing output signal to cause said counter to provide said code indicative of said angular position of said object and relatively independent of said velocity.

2. The apparatus according to claim 1 wherein said sensor means comprises an optical sensor with a target located on a surface of said rotating object and an optical element positioned with respect to said target to provide said output pulse for a revolution of said object.

3. The apparatus according to claim 1 further including strobe means coupled to said counter and operative to cause said counter to provide said code during the rotation of said object and independent of said sensor pulse.

4. The apparatus according to claim 1 wherein said controllable frequency source is a programmable frequency synthesizer.

5. The apparatus according to claim 1 wherein said sensor pulse is applied to said counter for resetting the same during said pulse to cause said counter to provide said code during each revolution of said object.

6. The apparatus according to claim 1 wherein said processing means operates to provide said output control signal according to the following equation:

$$fn = fn-1 \times (CD/CA)$$

where:
fn = new frequency to be provided by said source
fn−1 = previous frequency provided during last revolution
CD = desired count for a revolution
CA = actual count for said revolution.

7. The apparatus according to claim 6 wherein said processing means is a minicomputer.

8. The apparatus according to claim 1 wherein said sensor means is a magnetic sensor device.

9. The apparatus according to claim 1 wherein said rotating object is the rotor of a jet engine compressor rotating at a velocity relatively about 18,000 revolutions per minute.

10. The apparatus according to claim 1 further comprising pulse shaping means coupled to said sensor means and adapted to provide at an output a predetermined pulse of a relatively constant duration and amplitude.

* * * * *